(12) United States Patent
Takeshita

(10) Patent No.: US 6,323,079 B1
(45) Date of Patent: Nov. 27, 2001

(54) METHOD FOR MANUFACTURING A SEMICONDUCTOR DEVICE

(75) Inventor: Teruki Takeshita, Nobeoka (JP)

(73) Assignee: Asahi Kasei Microsystems Co., Ltd., Tokyo (JP)

( * ) Notice: Subject to any disclaimer, the term of this patent is extended or adjusted under 35 U.S.C. 154(b) by 0 days.

(21) Appl. No.: 09/445,087

(22) PCT Filed: Jan. 16, 1999

(86) PCT No.: PCT/JP99/02029

§ 371 Date: Dec. 2, 1999

§ 102(e) Date: Dec. 2, 1999

(87) PCT Pub. No.: WO99/56318

PCT Pub. Date: Nov. 4, 1999

(30) Foreign Application Priority Data

Apr. 24, 1998 (JP) ................................. 10-115264
Aug. 17, 1998 (JP) ................................. 10-230902

(51) Int. Cl.⁷ ............................................. H01L 21/8234
(52) U.S. Cl. ................... 438/238; 438/329; 438/642; 438/721
(58) Field of Search ................... 438/238, 241, 438/267, 329, 592, 642, 721, 725, 787, 790

(56) References Cited

U.S. PATENT DOCUMENTS

| | | |
|---|---|---|
| 5,488,246 | 1/1996 | Hayashide et al. .............. 257/336 |
| 5,600,165 | 2/1997 | Tsukamoto et al. .............. 257/323 |
| 5,604,157 | 2/1997 | Dai et al. ........................ 437/200 |
| 5,618,749 | 4/1997 | Takahashi et al. . |
| 5,872,054 | 2/1999 | Tsujita . |

FOREIGN PATENT DOCUMENTS

| | | |
|---|---|---|
| 43 11 761 | 10/1993 | (DE) . |
| 1-211958 | 8/1989 | (JP) . |
| 5-299338 | 11/1993 | (JP) . |
| 8-274257 | 10/1996 | (JP) . |
| 9-55351 | 2/1997 | (JP) . |

*Primary Examiner*—Charles Bowers
*Assistant Examiner*—Yennhu B. Huynh
(74) *Attorney, Agent, or Firm*—Finnegan, Henderson, Farabow, Garrett & Dunner, L.L.P.

(57) ABSTRACT

A method for forming a semiconductor device having a capacitor, a resistor and a MOS transistor with characteristics conforming to design. To this end, a polysilicon film (4), a capacitor-dielectric/insulating film (5), a polysilicon film (6) are deposited, and an upper electrode (7) of the capacitor is formed from the polysilicon film (6), and edge portions (7a) of the upper electrode (7) are oxidized. On top of this, an inorganic anti-reflection coating film (9) and a CAP oxide film (10) are deposited and etched to form a mask pattern (12) for forming the capacitor and the resistor. On the other hand, a tungsten silicide film (13), an inorganic anti-reflection coating film (14) and a CAP oxide film (15) are deposited and etched to form a mask pattern (17) for forming a gate electrode. The polysilicon film (4) is etched by using the mask patterns (12) and (17), leaving behind the tungsten silicide film (13) beneath the mask pattern 17.

6 Claims, 7 Drawing Sheets

PRIOR ART

US 6,323,079 B1

METHOD FOR MANUFACTURING A SEMICONDUCTOR DEVICE

TECHNICAL FIELD

The present invention relates to a semiconductor device and a method for manufacturing the semiconductor device, and more particularly to a method for manufacturing a semiconductor device, in which a capacitor and a resistor or a MOS transistor are arranged and also to a semiconductor device made by this method.

BACKGROUND OF THE ART

Conventionally, in integrated circuits (semiconductor devices) with high packaging density, elements are arranged closely and in some cases a plurality of resistors or MOS transistors may be arranged close to a capacitor. When a capacitor, resistors and MOS transistors are arranged in a dense layout, they are formed in a process shown in FIGS. 6 and 7, for example. More specifically, a field oxide film 2 is formed to cover an area $A_R$ for forming resistors R and an area $A_C$ for forming a capacitor C, while a gate oxide film 3 is formed with a thickness of about 250 (Å) in an area $A_{TR}$ for forming MOS transistors TR, and then a polysilicon film 4, a capacitor-dielectric/insulating film 5 and a polysilicon film for an upper electrode are formed on the field oxide film 2 and the gate oxide film 3. After a mask pattern is formed on an area where the upper electrode of the capacitor C is to be formed, the upper electrode 7 is formed by etching the polysilicon film for the upper electrode.(FIG. 6(a)).

Subsequently, a CAP oxide film 10 and a resist film 11 are deposited (FIG. 6(b)), then a resist pattern 11a is formed which is used to form the resistors R and the capacitor C from the resist film 11 by a photolithographic process (FIG. 6(c)), and by using this resist pattern as a mask, a mask pattern 12 for forming the resistor R and the capacitor C is formed by etching the CAP oxide film 10 (FIG. 6(d)).

Next, a tungsten silicide film 13 and a CAP oxide film 15 are deposited, and a resist film 16 is formed (FIG. 6(e)). A resist pattern 16a for forming the gate electrodes of the MOS transistors TR is formed from the resist film 16 by a photolithographic process (FIG. 7(a)), and by using this resist pattern as a mask, a mask pattern 17 for forming the gate electrodes is formed by etching the CAP oxide film 15, and then the resist pattern 16a is removed (FIG. 7(b)).

When the tungsten silicide film 13 is etched away by using the mask pattern 17 for forming the gate electrodes as an etching mask and the mask pattern 12 for forming the resistors R and the capacitor C is exposed, the polysilicon film 4 is etched away by using this mask pattern 12 and also the mask pattern 17 for forming the gate electrodes (FIG. 7(c)). An LDD forming oxide film by which to form an LDD structure is formed, and the LDD forming oxide film is etched anisotropically to form side-walls (FIG. 7(d)), finally a thin oxide film is formed on the exposed silicon substrate 1 by heat treatment in an oxidizing atmosphere, and this thin oxide film is shaped into a mask for ion implantation to form source and drain diffused regions (FIG. 7(e)).

Thus, a plurality of resistors R, a capacitor C and a plurality of gate electrodes TR-G have been formed. By diffusing impurities into the active region by using the gate electrodes TR-G and the side-walls 18 as masks, a plurality of transistors TR are formed each having source and drain diffused regions of the LDD structure in which the source and drain are of dual structure.

However, in the above-mentioned conventional method, there are a difference in height between the capacitor C and the resistors R and another difference in height between the capacitor C and the MOS-transistor gate electrodes TR-G. Therefore, the thickness of the resist film is uneven in the resistor-forming area $A_R$ and the transistor-forming area $A_{TR}$, with the result that the resist film differs in thickness between at a part α near the capacitor C and at a part β away from the capacitor C. Consequently, in the exposure step in the formation of the resist pattern, light intensity acting on the resist film differs between at the part α and at the part β of the resist film owing to the standing-wave effect. For this reason, there is a possibility that resistors R or gate electrodes TR-G designed with the same width on a reticle are formed with difference widths in the patterned resist.

If the width differs among resistors R or among gate electrodes TR-G, this causes differences in resistance value among the resistors R designed to have the same resistance value and also leads to differences in characteristics among MOS transistors designed to have identical characteristics, and thus a problem of lowering of analog characteristics arises.

A possible way of suppressing variations in light intensity owing to the standing-wave effect by reducing the thickness variation of the resist film is to dispose the resistors R and the MOS transistors TR in positions remote from the capacitor C. However, this method is not preferable because it increases the chip area and leads to a decrease in the component packaging density.

In the step of FIG. 7(e), after the side-walls 18 have been formed by anisotropic etching, a thin oxide film is formed in the exposed surfaces of the silicon substrate 1 by heat treatment in an oxidizing atmosphere. In this heat treatment, those parts of the polysilicon film 4 which are to become the resistors R are also oxidized because those parts are exposed to the oxidizing atmosphere. For reasons such as the unevenness of the thickness of the oxide film above the resistors R after the side-walls for forming the LDD structure have been formed, if in a wafer or in a chip there is variation in diffusion level of oxygen as the oxidizing gas, this results in variation in the thickness of the polysilicon film 4 and also in the resistance value among the resistors R designed to have identical characteristics, which has been a problem.

Problems with the capacitor C are that the etching step carried out to form the upper electrode 7 causes damage to the capacitor-dielectric/insulating film 5 near the edge of upper electrode 7 and in some cases causes a current to leak between the upper electrode 7 and the polysilicon film 4 as the lower and upper electrodes of the capacitor due to the electric field concentration at the lower side edge of the upper electrode 7.

The present invention has been made with those conventional, unsolved problems taken into consideration. The present invention has as its object to form a resistor or a MOS transistor that have characteristics as designed in a semiconductor device in which a capacitor and a resistor or a MOS transistor are arranged.

DISCLOSURE OF THE INVENTION

To achieve the above objects, the present invention provides a method for manufacturing a semiconductor device including a MOS transistor having a gate electrode consisting of a polysilicon film and a metal silicide, a capacitor consisting of polysilicon films as upper and lower electrodes and a capacitor-dielectric/insulating film placed therebetween, and a resistor consisting of a polysilicon film. The method for manufacturing a semiconductor device comprises the steps of depositing a first polysilicon film, a capacitor-dielectric/insulating film and a second polysilicon film on a semiconductor substrate in this order and patterning the second polysilicon film to form the upper electrode of the capacitor; depositing a first inorganic anti-reflection coating film and patterning the first inorganic anti-reflection coating film to form a mask pattern for forming the capacitor and the resistor on a capacitor-forming area and a resistor-forming area; depositing a metal silicide film and a second inorganic anti-reflection coating film in this order and patterning the second inorganic anti-reflection coating film to form a mask pattern for forming the gate electrode on a gate electrode forming area; and etching away the metal silicide film and the first polysilicon film, leaving unetched the metal silicide film under the mask pattern for forming the gate electrode, by using the mask patterns for forming the resistor, capacitor and gate electrode as masks, wherein the resistor and the capacitor are formed with the inorganic anti-reflection coating film in the upper layers thereof with the metal silicide film omitted, the gate electrode of the MOS transistor is formed with the metal silicide film in the upper layer thereof with the inorganic anti-reflection coating film formed on top of the metal silicide film.

Heat treatment may be effected in an oxidizing atmosphere to an extent that lower side edge portions of the upper electrode recede slightly after the step for forming the upper electrode has been finished.

An insulating film may be formed on the first inorganic anti-reflection coating film.

An insulating film may be formed on the second inorganic anti-reflection coating film.

A SiN film or a SiON film may be used for the first and second inorganic anti-reflection coating films.

More specifically, the second polysilicon film is patterned to form an upper electrode of the capacitor on a multi-layered structure of a first polysilicon film, a capacitor dielectric/insulating film and a second polysilicon film. On the multi-layered structure of various films on a semiconductor substrate, which includes the upper electrode formed as described, a first inorganic anti-reflection coating film is deposited, and the multi-layered structure is patterned to form mask patterns for forming a capacitor and a resistor in capacitor-forming and resistor-forming areas.

After this, on the multi-layered structure on which the mask patterns for forming a capacitor and a resistor have been formed, a metal silicide film and a second inorganic anti-reflection coating film are deposited, and the second inorganic anti-reflection film is patterned to form mask patterns for forming a gate electrode in a gate electrode-forming area.

The metal silicide film and the first polysilicon film are etched by using the mask patterns for forming a capacitor, a resistor and a gate electrode as masks, so that the first polysilicon film is etched away, leaving unetched the metal silicide film beneath the mask pattern for forming a gate electrode. Consequently, the resistor and the capacitor are formed with the inorganic anti-reflection coating film in the upper layers thereof with the metal silicide film omitted. On the other hand, the gate electrode of the MOS transistor is formed with the metal silicide film in the upper layer thereof and on top of the metal silicide film, the inorganic anti-reflection coating film is formed.

When a resist film, for example, is deposited and a mask pattern for forming a resistor and a mask pattern for forming a gate electrode are formed from the resist film, if the capacitor, the resistor and the gate electrode are arranged close to each other, the thickness of the resist film does not become uniform in the vicinity of the capacitor due to differences in height between the upper electrode and the resistor or the gate electrode. For this reason, at exposure in photolithography, it sometimes occurs that the light intensity varies due to the standing-wave effect, resulting in deterioration in the accuracy of patterning of the resist film, which leads to decreases in the dimensional accuracy of the mask pattern for forming a resistor and a gate electrode. However, because the resistor, the capacitor and the gate electrode are formed with the inorganic anti-reflection coating film in the upper layers thereof, by this inorganic anti-reflection coating film, the light intensity is adjusted, thus preventing a decrease in the dimensional accuracy of the mask pattern due to the unevenness of the thickness of the resist film.

Above all, by a heat treatment in an oxidizing atmosphere conducted to an extent that the lower side edge portions of the upper electrode recede slightly, the portions, damaged during etching of the upper electrode, of the capacitor-dielectric/insulating film near the edge portions of the upper electrode are repaired, and the electric field concentration at the lower side edge portions of the upper electrode can be alleviated.

The present invention provides a semiconductor device comprising a MOS transistor having a gate electrode formed by depositing a polysilicon film, a metal silicide film and an inorganic anti-reflection coating film in this order, a capacitor formed by depositing polysilicon films as upper and lower electrodes and a capacitor-dielectric/insulating film placed therebetween, and a resistor formed by depositing a polysilicon film and an inorganic anti-reflection coating film in this order.

More specifically, because the gate electrode of the MOS transistor and the resistor are formed including an inorganic anti-reflection coating film, for example, in the step for forming a MOS transistor and a resistor, even when the resist film is formed so as to cover the areas where a MOS transistor and a resistor are to be created and respective mask patterns are formed by patterning the resist film by a photolithographic process and the elements are formed by using the mask patterns, in the photolithographic process the light intensity at exposure can be adjusted by means of the inorganic anti-reflection coating film formed below the resist film. Therefore, it becomes possible to avoid a decrease in the dimensional accuracy of the mask pattern due to the unevenness of the thickness of the resist film, which is caused by differences in height attributable to the presence of the upper electrode of the capacitor thereby becoming possible to obtain a semiconductor device which the width of each element conform to the width of the design value.

The present invention provides a method for manufacturing a semiconductor device having a capacitor including conductive films as upper and lower electrodes, comprising the steps of: depositing a first conductive film, a capacitor-dielectric/insulating film and a second conductive film on a semiconductor substrate in this order and patterning said second conductive film to form an upper electrode of said capacitor; performing a heat treatment in an oxidizing atmosphere to an extent that lower side edge portions of said upper electrode recede slightly; and patterning said first conductive film to form a lower electrode of said capacitor.

More specifically, the first conductive film, the capacitor-dielectric/insulating film and the second conductive film are deposited on a semiconductor substrate in this order, and from this multi-layered structure, the second conductive film is patterned to form the upper electrode of the capacitor. After this upper electrode has been formed, heat treatment is conducted in an oxidizing atmosphere to an extent that the lower side edge portions of the upper electrode recede slightly and then the lower electrode of the capacitor is formed.

This heat treatment repairs the damage by etching in the capacitor-dielectric/insulating film around the edge of the upper electrode during etching of the upper electrode and alleviates the electric field concentration at the lower side edge portions of the upper electrode.

The present invention provides a method for manufacturing a semiconductor device including the step of forming a resistor comprising a polysilicon film on an insulating film, wherein an oxygen-impermeable film not permitting oxygen to pass through is formed on the polysilicon film.

A SiN film or a SiON film may be used for the oxygen-impermeable film.

More specifically, after a polysilicon film for forming a resistor is formed or after another film is formed on the polysilicon film, for example, an oxygen-impermeable not permitting oxygen to pass through is formed. Thus, an oxygen-impermeable film, such as a SiN film or a SiON film, is formed directly on the polysilicon film that is to become a resistor or above the polysilicon film.

After a polysilicon film for forming a resistor has been formed on a semiconductor substrate or after a resistor has been etched from the polysilicon film, for purposes, such as oxidation to create another element, for example, when the semiconductor substrate is exposed to an oxidizing atmosphere, the polysilicon film is oxidized or particularly if oxidation is conducted to form a plurality of resistors, if there is variation in the thickness of oxygen diffusion level, there is variation in the thickness of the polysilicon film among the resistors. As the result, there are variations in characteristics among the resistors.

However, in fact, the oxygen-impermeable film has been formed directly on the polysilicon film or above the poly-silicon film. Therefore, after the polysilicon film is formed on the semiconductor substrate or after the resistor is etched from the polysilicon film, even if the semiconductor substrate is exposed to an oxidizing atmosphere, owing to the oxygen-impermeable film the top surface of the polysilicon film is prevented from being oxidized, so that the thickness of the polysilicon film is prevented from varying and the variation of the characteristics among the resistors can be avoided.

BEST MODE FOR CARRYING OUT THE INVENTION

Figure 1A:
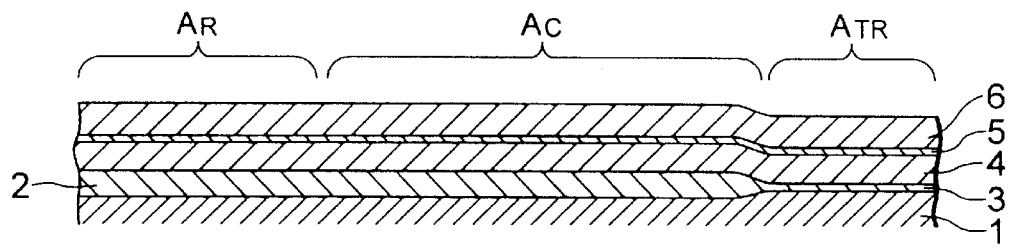
FIG. 1 shows sectional views representing a part of the manufacturing process of a semiconductor device according to the present invention.

The modes for carrying out the present invention will be described with reference to embodied examples.

As shown in FIG. 1($a$), a field oxide film 2 is formed in an area $A_R$ for forming resistors R and an area Ac for forming a capacitor of a silicon substrate 1, a gate oxide film 3 with a thickness of about 250 (Å) is formed in an area $A_{TR}$ for forming MOS transistors TR, a polysilicon film 4 with a thickness of 3000 (Å) is formed for example by reduced pressure CVD on the field oxide film 2 and the gate oxide film 3, and the polysilicon film 4 is doped with phosphorus as impurity by vapor phase diffusion. This polysilicon film 4 is used as the lower electrode of the capacitor C, and also used as the lower portion of a multi-layered structure of the metal silicide film and the polysilicon film, which are the components of the gate electrodes TR-G of the MOS transistors TR. Furthermore, the polysilicon film 4 is also used as the resistors R.

A capacitor-dielectric/insulating film 5 is grown to a thickness of about 450 (Å) on the surface of the polysilicon film 4 by thermal oxidation in an oxidizing atmosphere. This capacitor-dielectric/insulating film 5 maybe grown by CVD. As with the polysilicon film 4 mentioned above, a polysilicon film 6 is deposited on the capacitor-dielectric/insulating film 5 to a thickness of about 300 (Å) and is doped with phosphorus. This polysilicon film 6 is shaped into the upper electrode of the capacitor C.

A resist pattern is formed where the upper electrode of the capacitor C is disposed, and the polysilicon film 6 is etched with the resist pattern as a mask. After this, the resist pattern is removed. Thus, the upper electrode 7 of the capacitor C is formed (FIG. 1($b$)).

As shown in FIG. 1($b$), thermal oxidation is carried out to such an extent that the edge portions 7$a$ of the upper electrode 7 are oxidized in an oxidizing atmosphere. This thermal oxidation is made to take place in such a way that an oxide film grows to a thickness of about 100 (Å) on the single crystal silicon substrate when a single crystal silicon is oxidized. for example, for ten minutes at a temperature of 800(° C.) in an oxidizing atmosphere of a mixed gas of $O_2$ gas at a feed rate of 4.5 (l/min) and $H_2$ gas at a feed rate of 8 (l/min). Preferably, thermal oxidation should be such that an oxide film with a thickness of about 50–200 (Å) is grown on a single crystal.

By thermal oxide growth under the above conditions, an oxide film with a thickness of about 300–1000 (Å) is formed on the polysilicon film 4.

This thermal oxidation is performed to avoid etching-induced damage to parts of the capacitor-dielectric/insulating film 5 close to the lower side edge portions of the upper electrode 7 and to preclude a current leak from occurring between the upper electrode 7 and the polysilicon 4 as the lower and upper electrodes of the capacitor C due to electric field concentration at the lower side edge portion 7$a$ of the upper electrode 7 during etching of the upper electrode 7. At the same time, because the etching-induced damage to the capacitor-dielectric/insulating film 5 on the polysilicon film 4, which is made into the resistors R, is repaired and the capacitor-dielectric/insulating film 5 is grown further by the thermal oxidation, dopants in the polysilicon film can be prevented from diffusing out into an inorganic anti-reflection coating film, which is to be deposited later, and resistance values can be prevented from dispersing.

Figure 1B:
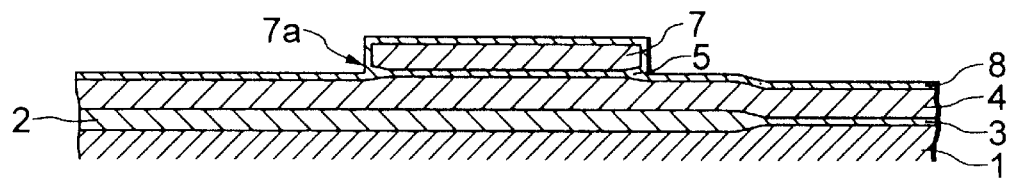
Figure 1C:
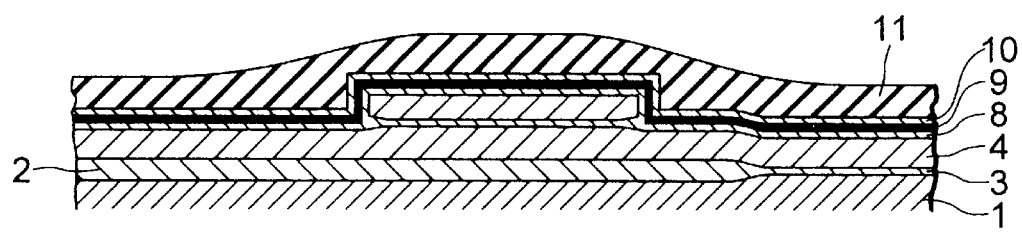

As shown in FIG. 1(c), on an oxide film 8 formed by the above-mentioned thermal oxidation process, an inorganic anti-reflection coating film (SiON) 9 about 700 (Å) thick is formed, for example, by plasma CVD using source gases of $SiH_4$, $N_2O$ and He. This inorganic anti-reflection coating film 9 is intended to suppress the variations in the standing-wave effect attending on the unevenness of the resist film and to make uniform the light intensity in the resist film. It is possible to adjust the refractive index and the extinction coefficient by changing the ratios of oxygen O, nitrogen N and hydrogen H in the SiON film 9, and it is also possible to adjust the light intensity by adjusting the refractive index, the extinction coefficient and the film thickness. For example, a suitable resist film for the i ray is an inorganic anti-reflection coating film 9, which is formed by a mixed gas of $SiH_4$, $N_2O$ and He at ratios of 54 (sccm) of $SiH_4$, 59 (sccm) of $N_2O$ and 3000 (sccm) of He. In this case, the refractive index is 2.50 and the extinction coefficient is 0.35.

For the inorganic anti-reflection coating film 9, amorphous carbon or TiN may be applied.

Figure 1D:
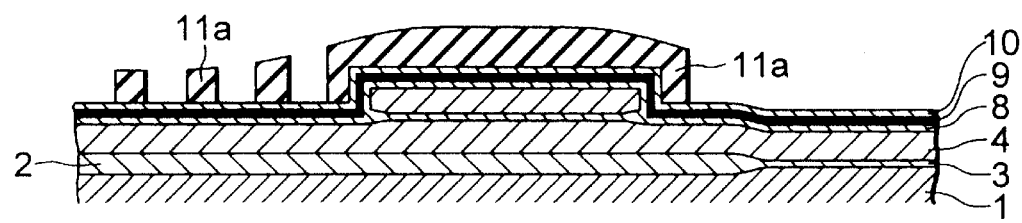

Subsequently, on the inorganic anti-reflection coating film 9, a CAP oxide film (a silicon dioxide film that serves as a mask for forming the resistors R later) 10 with a thickness of about 1000 (Å) is formed, for example, by thermal decomposition of TEOS (tetraethoxysilane), and on top of the CAP oxide film, a resist film 11 is formed. By performing a photolithographic process on the resist film 11, a resist pattern 11a is formed in the portion of the capacitor-forming area $A_C$ in which a capacitor C is formed and also in the portions of the resistor-forming area $A_R$ in which resistors R are formed (FIG. 1(d)). Note that the resist pattern 11a is deposited in the portion where the capacitor C is formed such that the resist pattern 11a covers the top surface and the side surfaces of the upper electrode 7 as shown in FIG. 1(d).

Figure 1E:
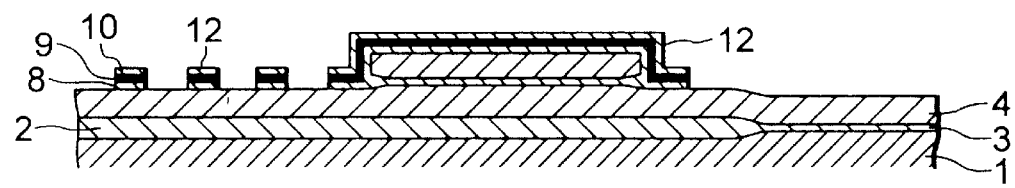

A mask pattern 12 is formed by etching the CAP oxide film 10, the inorganic anti-reflection coating film 9 and the oxide film 8 by using the resist pattern 11a as a mask, and then the resist pattern 11a is removed (FIG. 1(e)). This mask pattern 12 is used as a mask for etching the metal silicide film and the polysilicon film 4 in the resistor-forming area Ar and the capacitor-forming area Ac in subsequent steps, and the mask pattern 12 is deposited on the top surface and side surfaces of the upper electrode 7 as shown in FIG. 1(e).

Figure 2A:
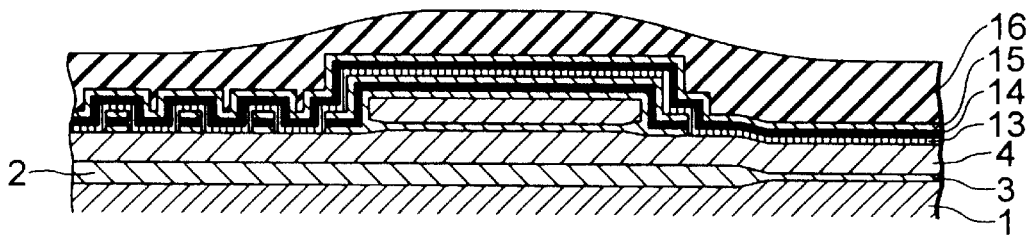
FIG. 2 shows sectional views representing the rest of the manufacturing process in FIG. 1.

After this, a tungsten silicide film 13 about 2000 (Å) thick is formed as a metal silicide on the polysilicon film 4 and on the mask pattern 12. In the same manner as with the inorganic anti-reflection coating film 9, an inorganic anti-reflection coating film 14 with a thickness of about 300 (Å) is formed on the tungsten silicide film 13. On the inorganic anti-reflection coating film 14, a CAP oxide film 15 (a silicon dioxide film used as a mask for forming gate electrodes TR-G later) with a thickness of about 1000 (Å) is formed, for example, by thermal decomposition of TEOS (tetrathoxysilane), and on top of the CAP oxide film 15, a resist film 16 is formed (FIG. 2(a)).

Figure 2B:
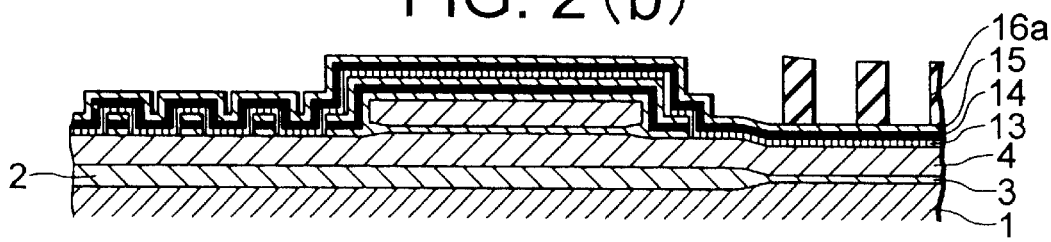
Figure 2C:
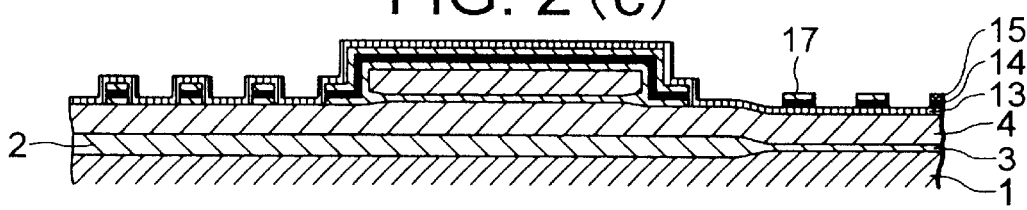

The resist film 16 is patterned by a photolithographic process to form resist patterns 16a where gate electrodes TR-G of MOS transistors are to be formed (FIG. 2(b)). By using the resist patterns 16a as masks, the CAP oxide film 15 and the inorganic anti-reflection coating film 14 are etched to form mask patterns 17, and after this, the resist patterns 16a are removed (FIG. 2(c)).

Figure 2D:
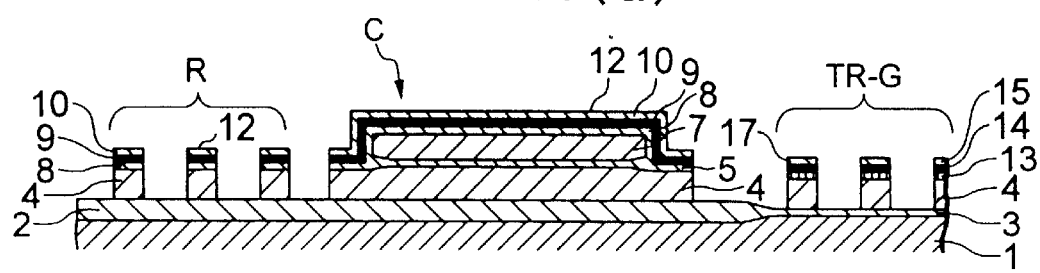

Next, by using the mask patterns 17 as masks, the multi-layered structure is etched by plasma etching, for example. When, as the result, the tungsten silicide 13 is etched away and mask patterns 12 are exposed, because the mask patterns 12 serve as masks, the polysilicon film 4 is etched with the mask patterns 12 and 17 (FIG. 2(d)). At this time, in the transistor-forming area $A_{TR}$, the mask patterns 17 remain unetched, and each of those multi-layered structures consists of a polysilicon film 4, a tungsten silicide film 13, an anti-reflection coating film 14 and a CAP oxide film 15. Each of those multi-layered structures forms a gate electrodes TR-G of a MOS transistor TR. In the resistor-forming area $A_R$, each mask pattern 12 is a multi-layered structure of a polysilicon film 4, an oxide film 8, an inorganic anti-reflection coating film 9 and a CAP oxide film 10, and this multi-layered structure forms a resistor R. In the capacitor-forming area $A_C$, the mask pattern 12 is a multi-layered structure of a polysilicon 4, a capacitor-dielectric/insulating film 5, an upper electrode 7, an oxide film 8, an inorganic anti-reflection coating film 9 and a CAP oxide film 10, and this multi-layered structure forms a capacitor C.

Subsequently, over the whole area including areas $A_{R, AC}$, and $A_{TR}$, an oxide film is formed which is used to form the LDD structure by a method such as reduced pressure CVD using thermal decomposition of TEOS, for example, side-walls 18 are formed by anisotropic etching of the oxide film, for example, and thereafter a thin oxide film is formed on the exposed silicon substrate 1 by heat treatment in an oxidizing atmosphere (FIG. 2(e)).

By diffusing impurities into the active region with the gate electrodes TR-G and side-walls 18 as masks, source and drain diffused regions (not shown) of LDD structure are formed in which the source and drain are of dual structure.

Here, the polysilicon film 4 corresponds to the first polysilicon film and the first conductive film, the polysilicon film 6 corresponds to the second polysilicon film and the second conductive film, the inorganic anti-reflection coating film 9 corresponds to the first inorganic anti-reflection coating film and the oxygen-impermeable film, the tungsten silicide film 13 corresponds to the metal silicide film, and the inorganic anti-reflection coating film 14 corresponds to the second inorganic anti-reflection coating film.

As mentioned above, the inorganic anti-reflection coating films 9 and 14 are laid below the resist films 11 and 16, and under this condition the resist films 11 and 16 are subjected to exposure in a photolithographic process to form the resist patterns 11a and 16a. By this arrangement, it becomes possible to suppress variations in the standing-wave effect in the respective areas attributable to the unevenness of the thickness of the resist film, more specifically, the resist film 11 in the area $A_R$ where a plurality of resistors R are to be formed and the resist film 16 in the area $A_{TR}$ where gate electrodes TR-G of a plurality of MOS transistors TR are to be formed. Thus, the resist patterns 11a for forming the resistors R and the resist patterns 16a for forming gate electrodes TR-G can be formed with the intended high accuracy. On account of this, the resistors R in the resistor-forming area $A_R$ and the gate electrodes TR-G in the transistor-forming area $A_{TR}$ can be formed such that the resistors R have the same widths and the gate electrodes TR-G have the same widths, and the variations of characteristics can be repressed among the resistors R and among the transistors TR.

Figure 3A:
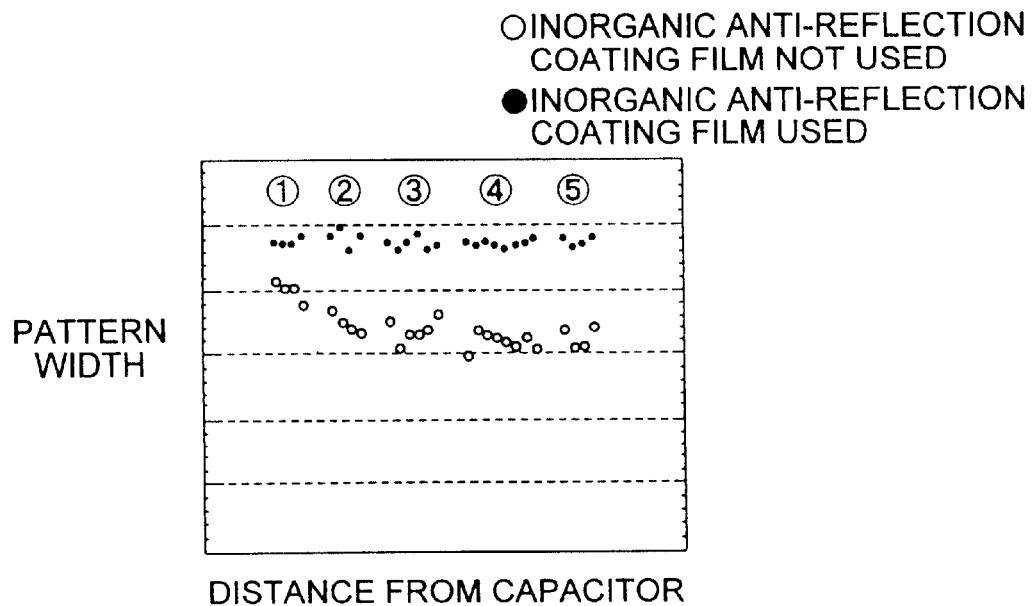
FIG. 3 shows measurement results of variation in the width of the resist patterns and in the width of gate electrodes with respect to the distances of the transistors TR.
Figure 3B:
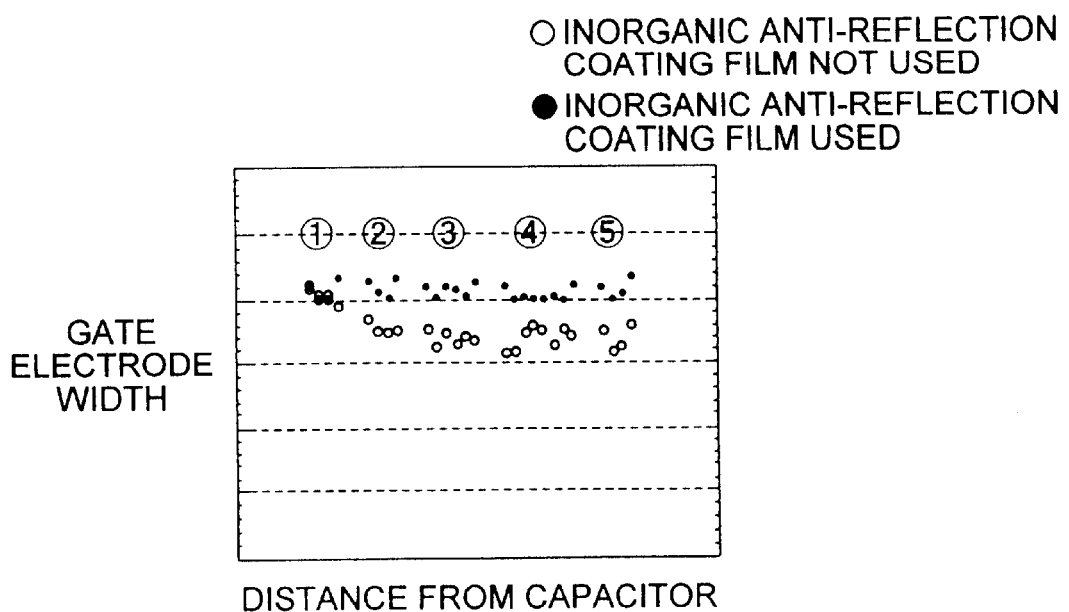

When, according to the above mode of embodiment, a capacitor C, a group of transistor ① and ② arranged close to the capacitor and a group of transistors ③ to ⑤ arranged relatively remote from the capacitor C were formed on a silicon substrate, results were obtained as shown in FIG. 3. In FIG. 3(a), the horizontal axis represents the distances from the capacitor C to the transistors, while the vertical axis represents the widths of the resist patterns 16a formed by a photolithographic process on the resist film. In FIG. 3(b), the horizontal axis represents the distances from the capacitor C to the transistors, while the vertical axis represents the widths of the above-mentioned gate electrodes TR-G. Note that the symbol ● denotes that an inorganic anti-reflection coating film was used and, on the other hand, the symbol ○ denotes that an inorganic anti-reflection coating film was not used.

As shown in FIGS. 3(a) and 3(b), when the distance from the capacitor C differs with the transistors, if an inorganic anti-reflection coating film is not used, variation occurs in the width of the resist patterns 16a, and accordingly variation arises in the width of the gate electrodes TR-G. However, it has been confirmed that if an inorganic anti-reflection coating film is used, the resist patterns 16a have an almost uniform width and as a result the gate electrodes TR-G have an almost identical width.

Figure 4:
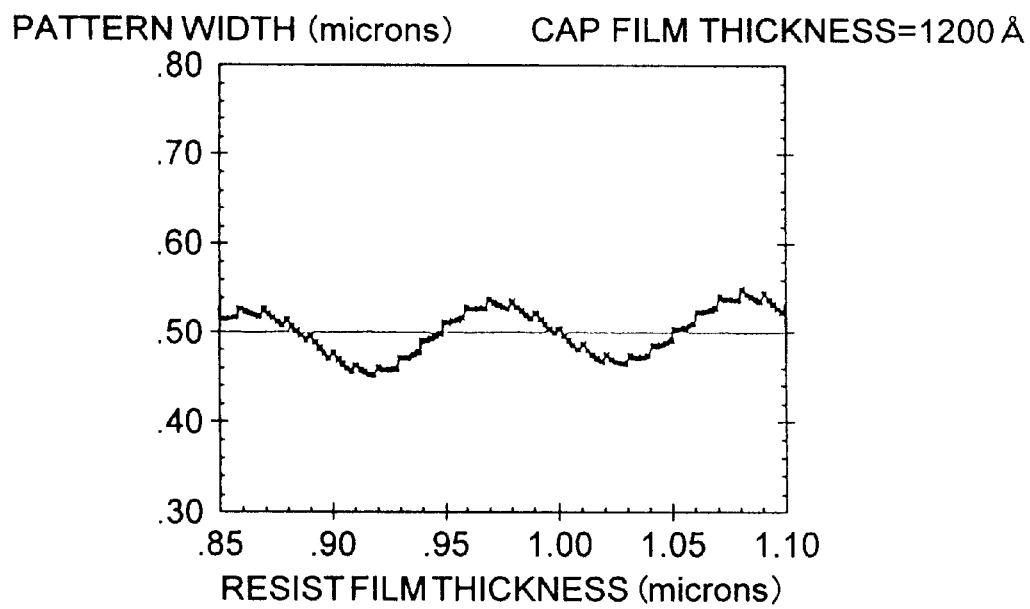
FIG. 4 shows measurement results of the variation in the width of the resist patterns in relation to the variation in the thickness of the resist films in two opposite cases where the inorganic anti-reflection coating film is used and is not used.
Figure 4:
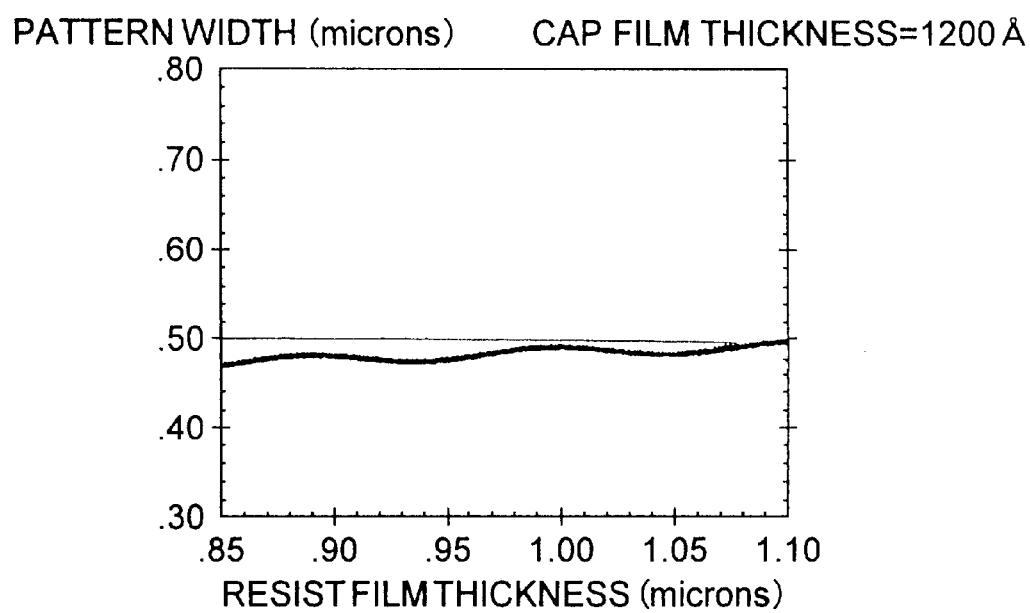

Measurements were made of changes in the width of the resist patterns (11a and 16a mentioned above) formed by photolithography of resist films in relation to changes in the thickness of the resist films (11 and 16 mentioned above) in two opposite cases: one where an inorganic anti-reflection coating film was used and the other where an inorganic anti-reflection coating film was not used. The results obtained are as shown in FIGS. 4 and 5. FIG. 4 shows measurement results in a case where the CAP oxide films to be etched by the above-mentioned resist patterns (CAP oxide films 10 and 15 mentioned above) have a thickness of 1200 [Å], and FIG. 5 shows measurement results in a case where the CAP oxide films have a thickness of 1700 [Å]. In both FIGS. 4 and 5, (a) denotes results when an inorganic anti-reflection coating film was not used and (b) denotes results when an inorganic anti-reflection coating film was used. The horizontal axis represents the thickness of the resist films and the vertical axis represents the widths of the resist patterns.

Figure 5A:
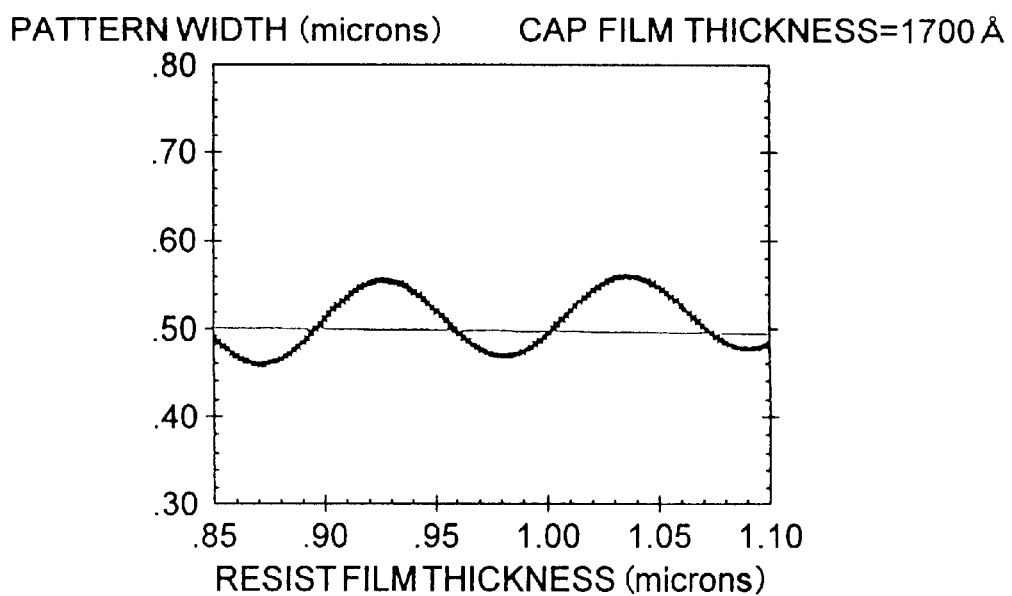
FIG. 5 shows measurement results of variation in the width of the resist patterns in relation to the variation in the thickness of the resist films in two opposite cases where the inorganic anti-reflection coating film is used and is not used, when the thickness of the CAP oxide film is different from that in FIG. 4.
Figure 5B:
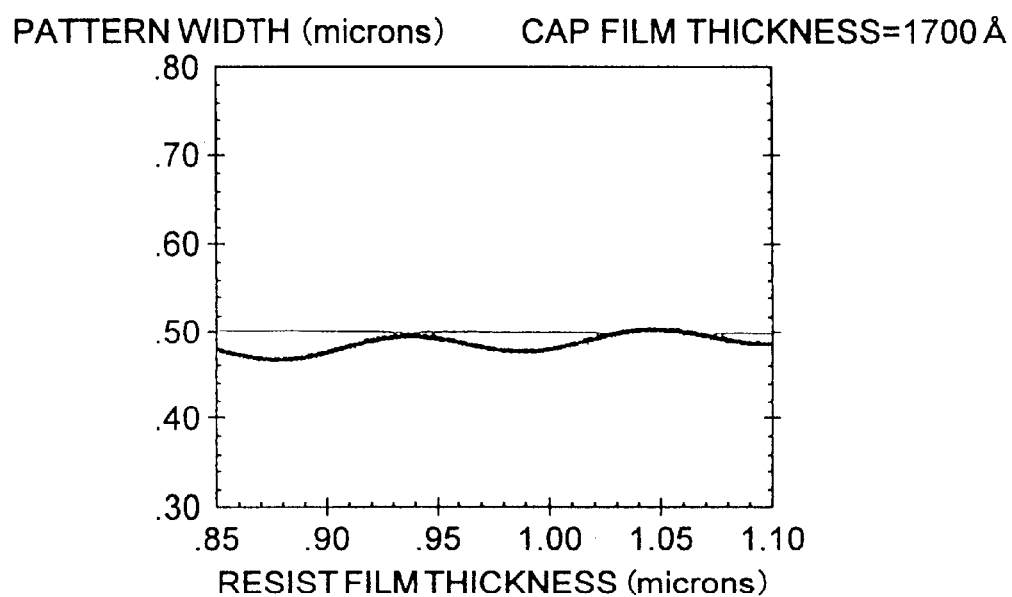
Figure 6A:
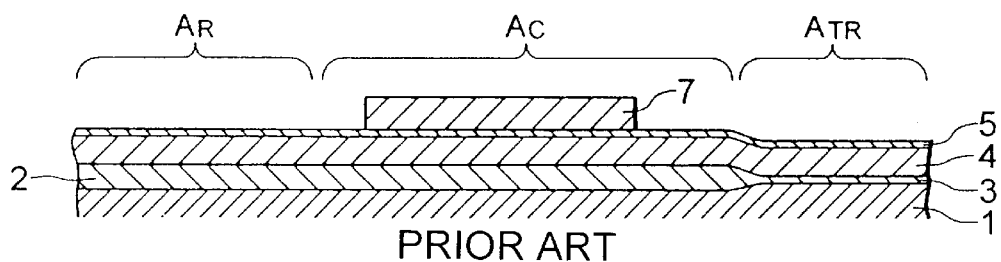
FIG. 6 shows sectional views representing a part of a conventional manufacturing process of a semiconductor device.
Figure 6B:
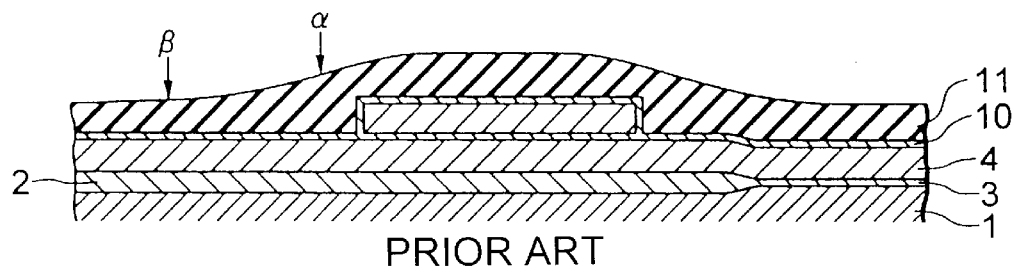
Figure 6C:
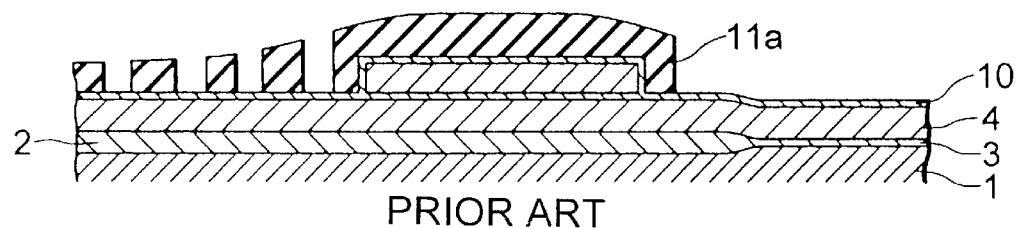
Figure 6D:
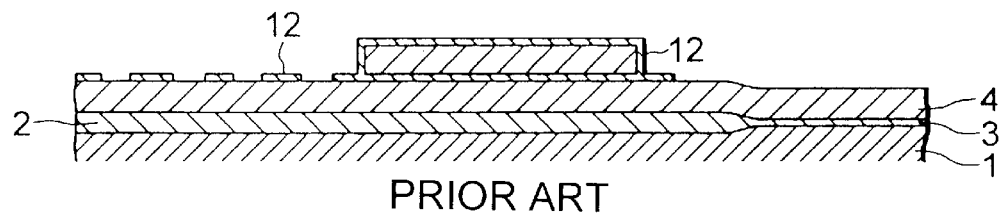
Figure 6E:
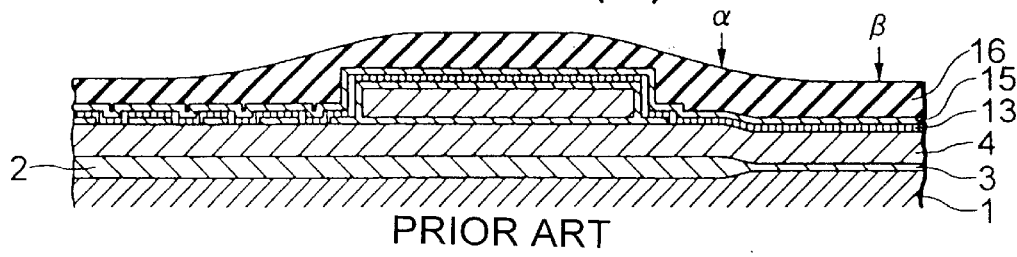
Figure 7A:
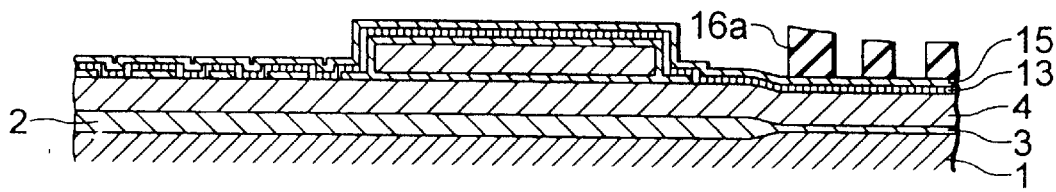
FIG. 7 shows sectional views representing the rest of the manufacturing process in FIG. 6.
Figure 7B:
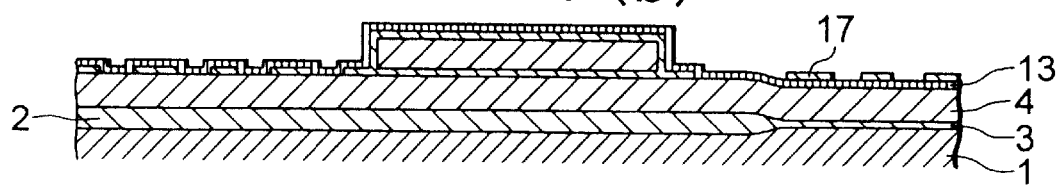
Figure 7C:
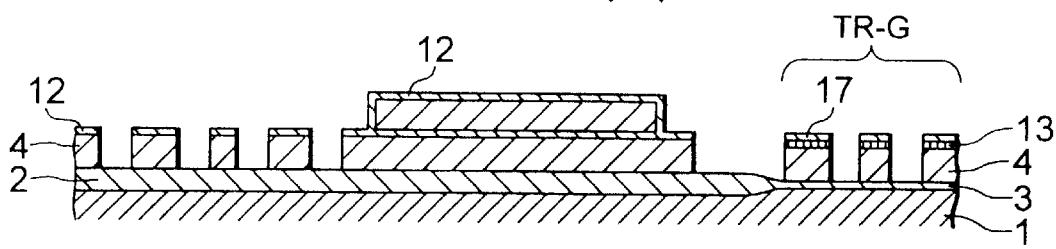
Figure 7D:
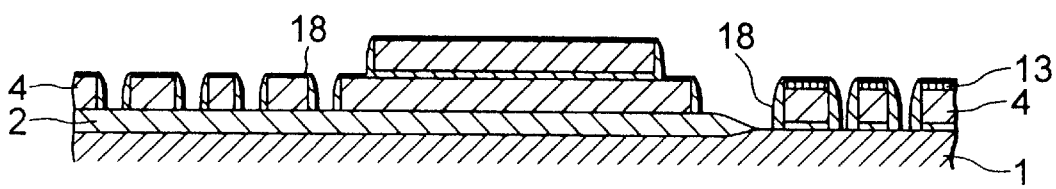
Figure 7E:
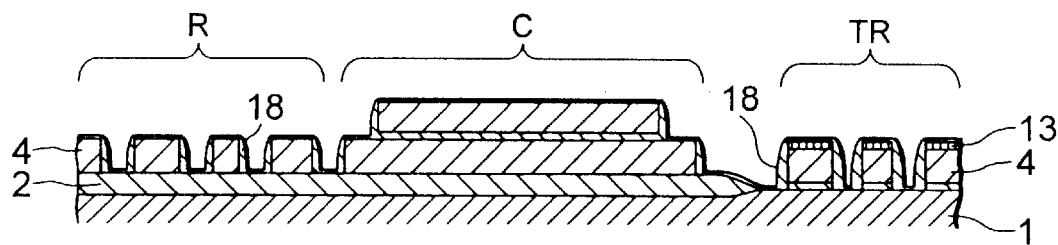

As shown in FIGS. 4(a) and 5(a), when an inorganic anti-reflection coating film was not used, as the thickness of the resist film increases, the width of the resist pattern changes in a swing curve as a sine wave with an amplitude of a certain magnitude. In contrast, when an inorganic anti-reflection coating film was used, the width of the resist pattern is almost uniform as shown in FIGS. 4(b) and 5(b).

Therefore, as shown in FIGS. 4(a) and 5(a), supposing the CAP oxide film has different thicknesses, the phase of the above-mentioned swing curve changes, and the resist pattern has different widths even if the resist film has a fixed thickness. For this reason, when one sets a thickness for the CAP oxide film, it is necessary to take into consideration a thickness condition of the CAP oxide film in the photolithographic process and a thickness condition of this film as a mask in the subsequent etching process. However, as shown in FIGS. 4(b) and 5(b), when the inorganic anti-reflection coating film is used, the width of the resist pattern is almost uniform regardless of the thickness of the CAP oxide film. Therefore, it is not necessary to consider the thickness condition of the CAP oxide film in the photolithographic process and it is only necessary to set the thickness of the CAP oxide film so as to satisfy the thickness condition of this film as a mask in the etching process later.

In the above embodiment, as shown in FIG. 1(b), after the upper electrode 7 has been formed by etching, thermal oxidation is carried out to such an extent that the edge portions 7a of the upper electrode 7 are oxidized. Therefore, it is possible to repair the etching-induced damages of the capacitor-dielectric/insulating film 5 at the edge portions 7a, and avoid electric field concentration at the edge portions 7a, prevent a current leak between the upper and lower electrodes of the capacitor C, and thus form a high-performance capacitor C.

Figure 2E:
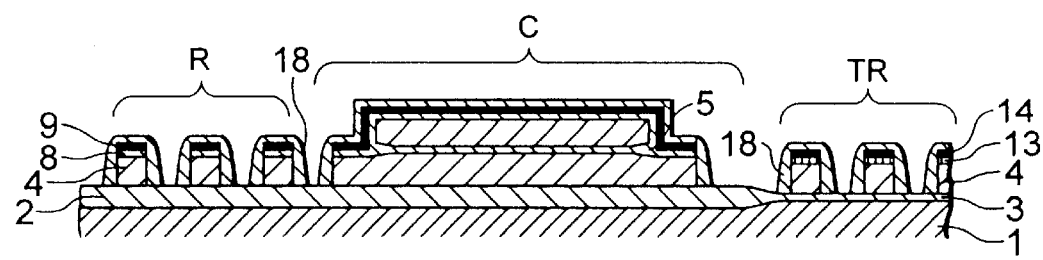

In the above embodiment, in the step shown in FIG. 2(e), after side-walls 18 were formed, before a thin oxide film is formed on the exposed silicon substrate 1, an inorganic anti-reflection coating film 9 is deposited above the polysilicon film 4 which is made into the resistors R. By research into the SiON film applied for the inorganic anti-reflection coating film 9, it has been confirmed that the SiON is an oxygen-impermeable film not permitting oxygen to pass through.

Meanwhile, when the silicon substrate 1 is exposed to an oxidizing atmosphere under the condition that the inorganic anti-reflection coating film 9 as an oxygen-impermeable film is not deposited as a layer above the polysilicon film 4, if there is variation in oxygen diffusion level for reasons such as the unevenness of the thickness of the oxide film above the resistors R after side-walls for forming the LDD structure has been formed, variation arises in the thickness of the polysilicon film 4, resulting in different characteristics among the resistors R.

However, because the inorganic anti-reflection coating film (SiON film) 9 as an oxygen-impermeable film is deposited as a layer above the polysilicon film 4, even when the silicon substrate 1 is exposed in an oxidizing atmosphere in the step shown in FIG. 2(e), the polysilicon film 4 that is to become resistors R is never oxidized, so that variation does not occur in the thickness of the polysilicon film 4. Therefore, it is possible to securely prevent variation in characteristics among the resistors R, which results from the oxidization process in an oxidizing atmosphere to form an oxide film in the exposed regions of the silicon substrate 1.

Because an oxygen-impermeable film is deposited as a layer above the polysilicon film 4 that is to become the resistors R, oxidation does not progress from the top surface of the polysilicon film 4, but oxidation progresses from the side faces of the polysilicon film 4. However, the variation in width dimension of the polysilicon film 4 due to oxidation of its side faces have smaller effects on the variation in characteristics of the resistors R than does the variation in the thickness of the polysilicon film 4 and poses no problem.

In the above embodiment, description has been made of a case where polysilicon is used for the first and second conductive films. However, the present invention is not limited to this material, but materials, such as tungsten or a metal silicide, can be applied.

In the above embodiment, description has been made of a case where a SiON is used for the inorganic anti-reflection coating film 9 that acts as an oxygen-impermeable film. A SiN film may be used as an oxygen-impermeable film.

In this case, it is necessary to form the inorganic anti-reflection coating film 9 and, on top of this film, form a SiN film as an oxygen-impermeable film. By so doing, it is possible to obtain the operational effects equivalent to those of the above-mentioned embodiment. When, for example, $Si_3N_4$ is used as the oxygen-impermeable film, after an inorganic anti-reflection coating film 9 is formed, on top of which a $Si_3N_4$ film is formed by a reduced pressure CVD process using a mixed gas of $SiH_4$ and $NH_3$ as a source gas. After this, the subsequent step is carried out in the same manner as in the above-mentioned embodiment. Note that the inorganic anti-reflection coating film 9 may be formed after the oxygen-impermeable film has been formed.

In the above embodiment, description has been made of a case where electronic elements are formed on a silicon substrate. The present invention is not limited to this mode of embodiment, but may be applied to a case where elements are formed on a sapphire substrate.

Further, in the above embodiment, the resistors R, the lower electrode of the capacitor C and the gate electrodes TR-G of transistors TR were made from the same polysilicon film. However, the present invention may be applied to a case where the resistors R, the upper electrode of the capacitor C and the upper electrodes TR-G of the transistors TR are formed from the same polysilicon film, in which case the operational effects equivalent to those of the above embodiment can be obtained.

INDUSTRIAL APPLICABILITY

As has been described, according to the method for manufacturing a semiconductor device of the present invention, a mask pattern for forming a capacitor, a MOS transistor and a resistor is formed by patterning a first inorganic anti-reflection coating film and a second inorganic anti-reflection coating film. By this method, the dimensional accuracy of the mask patterns can be prevented from deteriorating, which could occur due to the unevenness of the thickness of the resist film, which is ascribable to differences in height around the upper electrode of the capacitor.

Particularly, because, after the upper electrode of the capacitor has been formed, heat treatment is conducted in an oxidizing atmosphere to an extent that the lower side edges of the upper electrode recede slightly, the portions, damaged during etching of the upper electrode, of the capacitor-dielectric/insulating film close to the edge portions of the upper electrode can be repaired, the electric field concentration at the lower side edge portions of the upper electrode is lessened, and a current leak between the upper and lower electrodes can be prevented from occurring.

According to the semiconductor device of the present invention, because a MOS transistor and a resistor are formed including an inorganic anti-reflection coating film, a semiconductor device can be obtained, in which the elements conform to design values with high accuracy even when the resist pattern are formed by photolithographic patterning of the resist film covering the MOS transistor and resistor in the manufacturing process.

According to the method for manufacturing a semiconductor device of the present invention, after the upper electrode of the capacitor has been formed, heat treatment is performed in an oxidizing atmosphere to such an extent that the lower side edges of the upper electrode recede slightly. By this heat treatment, the portions, damaged during etching, of the capacitor-dielectric/insulating film near the edge portions of the upper electrode during etching of the upper electrode can be repaired, the electric field concentration at the lower side edge portions of the upper electrode can be alleviated, and a current leak between the upper and lower electrodes can be prevented from occurring.

Further, according to the method for manufacturing a semiconductor device of the present invention, an oxygen-impermeable film, such as SiN or SiON, which does not allow oxygen to pass, is formed on the polysilicon film that is used to form the resistors. By this arrangement, even when oxidation is performed to form the other elements after the polysilicon film has been formed on the semiconductor substrate, the polysilicon film for forming a resistor can be prevented from being oxidized, and particularly when a plurality of resistors are formed from the polysilicon film, it is possible to prevent the characteristics from varying among the resistors due to oxidation mentioned above.

What is claimed is:

1. A method for manufacturing a semiconductor device including a MOS transistor having a gate electrode consisting of a polysilicon film and a metal silicide, a capacitor consisting of polysilicon films as upper and lower electrodes and a capacitor-dielectric/insulating film placed therebetween, and a resistor consisting of a polysilicon film, comprising the steps of:

depositing a first polysilicon film, a capacitor-dielectric/insulating film and a second polysilicon film on a semiconductor substrate in this order and patterning the second polysilicon to form the upper electrode of the capacitor;

depositing a first inorganic anti-reflection coating film and patterning the first inorganic anti-reflection coating film to form a mask pattern for forming the capacitor and the resistor on a capacitor-forming area and a resistor-forming area;

depositing a metal silicide film and a second inorganic anti-reflection coating film in this order and patterning the second inorganic anti-reflection coating film to form a mask pattern for forming the gate electrode on a gate electrode forming area; and etching away said metal silicide film and said first polysilicon film, leaving behind said metal silicide film under said mask pattern for forming said gate electrode, by using said mask patterns for forming said resistor, capacitor and gate electrode as masks, wherein said resistor and said capacitor are formed with said inorganic anti-reflection coating film in the upper layers thereof with said metal silicide film omitted, said gate electrode of said MOS transistor is formed with said metal silicide film in the upper layer thereof with said inorganic anti-reflection coating film formed on top of said metal silicide film.

2. A method for manufacturing a semiconductor device according to claim 1, further comprising heat treatment conducted in an oxidizing atmosphere to an extent that lower side edge portions of said upper electrode recede slightly after the step of forming said upper electrode is completed.

3. A method for manufacturing a semiconductor device according to claim 1 or 2, further comprising forming an insulating film on said first inorganic anti-reflection coating film.

4. A method for manufacturing a semiconductor device according to claim 1 or 2, further comprising forming an insulating film on said second inorganic anti-reflection coating film.

5. A method for manufacturing a semiconductor device according to claim 1 or 2, wherein said first and second inorganic anti-reflection coating films are formed of a SiN film or a SiON film.

6. A method for manufacturing a semiconductor device having a capacitor formed of conductive films as upper and lower electrodes, comprising the steps of:

depositing a first conductive film, a capacitor-dielectric/insulating film and a second conductive film on a semiconductor substrate in this order and patterning said second conductive film to form an upper electrode of said capacitor;

performing a heat treatment in an oxidizing atmosphere to an extent that lower side edge portions of said upper electrode recede slightly; and patterning said first conductive film to form a lower electrode of said capacitor.

* * * * *

UNITED STATES PATENT AND TRADEMARK OFFICE
CERTIFICATE OF CORRECTION

PATENT NO.    : 6,323,079 B1
DATED         : November 27, 2001
INVENTOR(S)   : Teruki Takeshita It is certified that error appears in the above-identified patent and that said Letters Patent is hereby corrected as shown below:

<u>Title page,</u>
Item [22], "Jan. 16, 1999" should read -- April 16, 1999 --

Signed and Sealed this

Sixteenth Day of April, 2002

Attest:

JAMES E. ROGAN
*Attesting Officer*     *Director of the United States Patent and Trademark Office*